(12) United States Patent
Ishimori et al.

(10) Patent No.: US 9,966,509 B2
(45) Date of Patent: May 8, 2018

(54) LIGHT EMITTING APPARATUS AND LIGHTING APPARATUS

(71) Applicant: PANASONIC INTELLECTUAL PROPERTY MANAGEMENT CO., LTD., Osaka (JP)

(72) Inventors: Atsuyoshi Ishimori, Osaka (JP); Toshifumi Ogata, Osaka (JP); Masumi Abe, Osaka (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 0 days. days.

(21) Appl. No.: 14/832,098

(22) Filed: Aug. 21, 2015

(65) Prior Publication Data
US 2016/0079492 A1  Mar. 17, 2016

(30) Foreign Application Priority Data

Sep. 12, 2014  (JP) .................................. 2014-186265

(51) Int. Cl.
*H01L 33/54* (2010.01)
*H01L 25/075* (2006.01)

(52) U.S. Cl.
CPC .......... *H01L 33/54* (2013.01); *H01L 25/0753* (2013.01); *H01L 2924/181* (2013.01)

(58) Field of Classification Search
CPC .................................. H01L 33/54; H01L 33/60
See application file for complete search history.

(56) References Cited

U.S. PATENT DOCUMENTS

| 7,525,127 | B2* | 4/2009 | Hattori | .................. | H01L 33/507 257/100 |
| 8,049,237 | B2 | 11/2011 | Yamada et al. | | |
| 9,024,343 | B2 | 5/2015 | Yamada et al. | | |
| 2002/0179919 | A1 | 12/2002 | Deisenhofer et al. | | |
| 2004/0080037 | A1* | 4/2004 | Foong | ............... | H01L 27/14618 257/687 |
| 2007/0170454 | A1* | 7/2007 | Andrews | ................. | H01L 33/52 257/100 |
| 2009/0166657 | A1 | 7/2009 | Yamada et al. | | |

(Continued)

FOREIGN PATENT DOCUMENTS

| JP | 2002-344026 A | 11/2002 |
| JP | 2009-182307 | 8/2009 |

(Continued)

OTHER PUBLICATIONS

Office Action issued in Japanese family member Patent Appl. No. 2014-186265, dated Feb. 20, 2018.

*Primary Examiner* — Asok K Sarkar
*Assistant Examiner* — Dmitriy Yemelyanov
(74) *Attorney, Agent, or Firm* — Greenblum & Bernstein, P.L.C.

(57) ABSTRACT

Light emitting apparatus including: substrate; LED chips on substrate; sealing member sealing LED chips; buffer layer on substrate; and dam material on the top surface of buffer layer, for holding back sealing member, wherein the adhesive strength of buffer layer to substrate and the adhesive strength of dam material to buffer layer are higher than the adhesive strength of dam material to substrate.

10 Claims, 7 Drawing Sheets

(56) References Cited

U.S. PATENT DOCUMENTS

| | | | |
|---|---|---|---|
| 2011/0254022 A1* | 10/2011 | Sasano | H01L 25/0753 257/88 |
| 2011/0303941 A1* | 12/2011 | Lee | H01L 33/486 257/98 |
| 2011/0309404 A1* | 12/2011 | Lee | H01L 33/486 257/99 |
| 2012/0007112 A1 | 1/2012 | Yamada et al. | |
| 2012/0205689 A1* | 8/2012 | Welch | H01L 25/0753 257/91 |
| 2013/0258658 A1* | 10/2013 | Hussell | H01L 25/0753 362/235 |
| 2015/0049480 A1 | 2/2015 | Ogata et al. | |
| 2015/0098225 A1 | 4/2015 | Abe et al. | |

FOREIGN PATENT DOCUMENTS

| | | |
|---|---|---|
| JP | 2011-100862 A | 5/2011 |
| WO | 2011/129203 | 10/2011 |

\* cited by examiner

LIGHT EMITTING APPARATUS AND LIGHTING APPARATUS

CROSS REFERENCE TO RELATED APPLICATION

This application claims the benefit of priority of Japanese Patent Application Number 2014-186265, filed Sep. 12, 2014, the entire content of which is hereby incorporated by reference.

BACKGROUND OF THE INVENTION

1. Field of the Invention

The present disclosure relates to a light emitting apparatus in which light emitting elements are mounted on a substrate, and a lighting apparatus using the light emitting apparatus.

2. Description of the Related Art

A semiconductor light emitting element, such as a light emitting diode (LED), is widely utilized as a highly efficient, space-saving light source in various lighting apparatuses for lighting applications, display applications, etc.

A light emitting apparatus (a light emitting module) in which a plurality of LEDs mounted on a substrate are enclosed around a light reflecting resin (hereinafter, also referred to as a dam material) is also known (see Japanese Unexamined Patent Application Publication No. 2009-182307 and WO2011/129203, for example).

SUMMARY OF THE INVENTION

In such a light emitting apparatus as described above, the dam material on the substrate may flake off from the substrate. Thus, it is a challenge to suppress flaking of the dam material to enhance reliability of the light emitting apparatus.

Thus, the present disclosure provides a light emitting apparatus which suppresses flaking of a dam material, and a lighting apparatus using the light emitting apparatus.

A light emitting apparatus according to one aspect of the present disclosure includes: a substrate; a light emitting element on the substrate; a sealing member sealing the light emitting element; a buffer layer on the substrate; and a dam material on a top surface of the buffer layer, for holding back the sealing member, wherein an adhesive strength of the buffer layer to the substrate and an adhesive strength of the dam material to the buffer layer are higher than an adhesive strength of the dam material to the substrate.

According to the present disclosure, a light emitting apparatus in which flaking of a dam material is suppressed, and a lighting apparatus using the light emitting apparatus are achieved.

BRIEF DESCRIPTION OF DRAWINGS

The figures depict one or more implementations in accordance with the present teaching, by way of examples only, not by way of limitations. In the figures, like reference numerals refer to the same or similar elements.

DETAILED DESCRIPTION OF THE PREFERRED EMBODIMENTS

Hereinafter, a light emitting apparatus, etc., according to exemplary embodiments of the present disclosure are to be described, with reference to the accompanying drawings. The exemplary embodiments described below are each general and specific illustration. Values, shapes, materials, components, and arrangement and connection between the components, steps, and the order of the steps shown in the following exemplary embodiments are merely illustrative and not intended to limit the present disclosure. Therefore, among the components in the exemplary embodiments below, components not recited in any one of the independent claims indicating the top level concept of the present disclosure are described as arbitrary components.

Figures are schematic views and do not necessarily illustrate the present disclosure precisely. In the figures, the same reference signs are used to refer to substantially the same configuration, and thus duplicate description may be omitted or simplified.

Embodiment 1

[Configuration of Light Emitting Apparatus]

Figure 1:
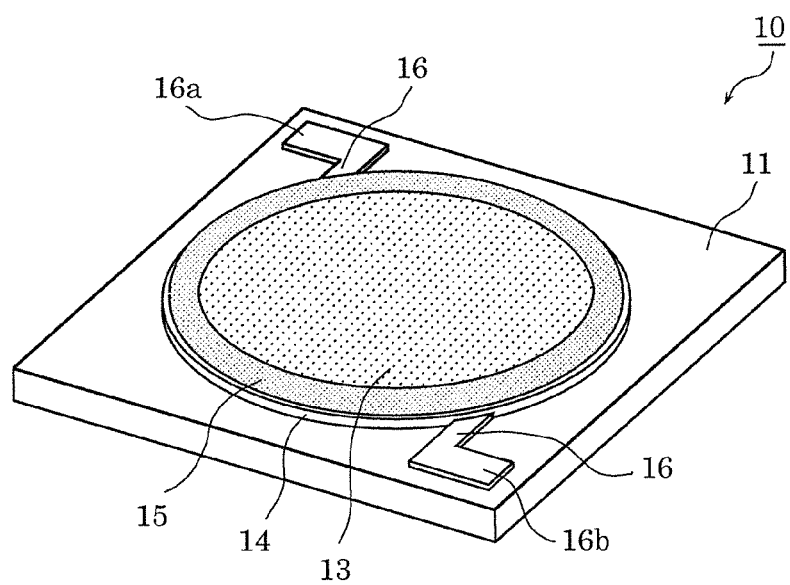
FIG. 1 is an external perspective view of a light emitting apparatus according to Embodiment 1.
Figure 2:
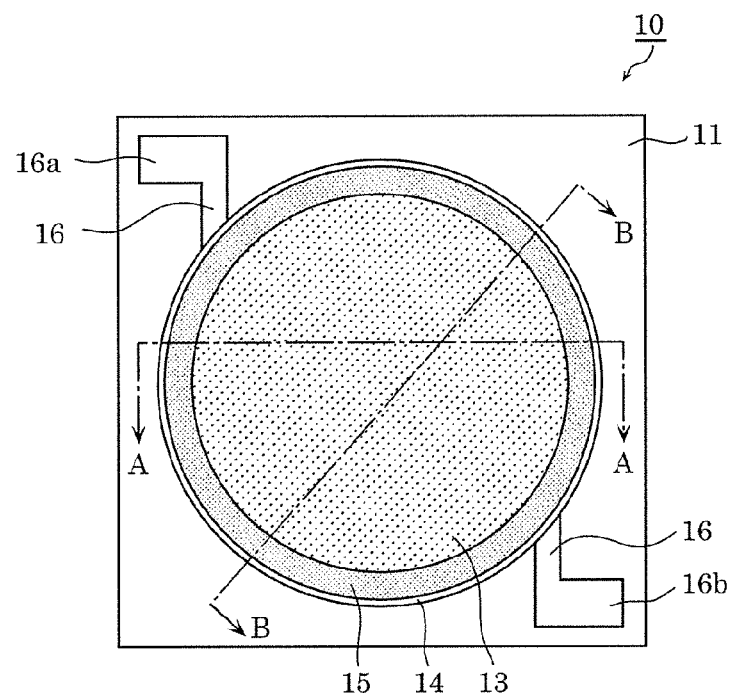
FIG. 2 is a plan view of the light emitting apparatus according to Embodiment 1.
Figure 3:
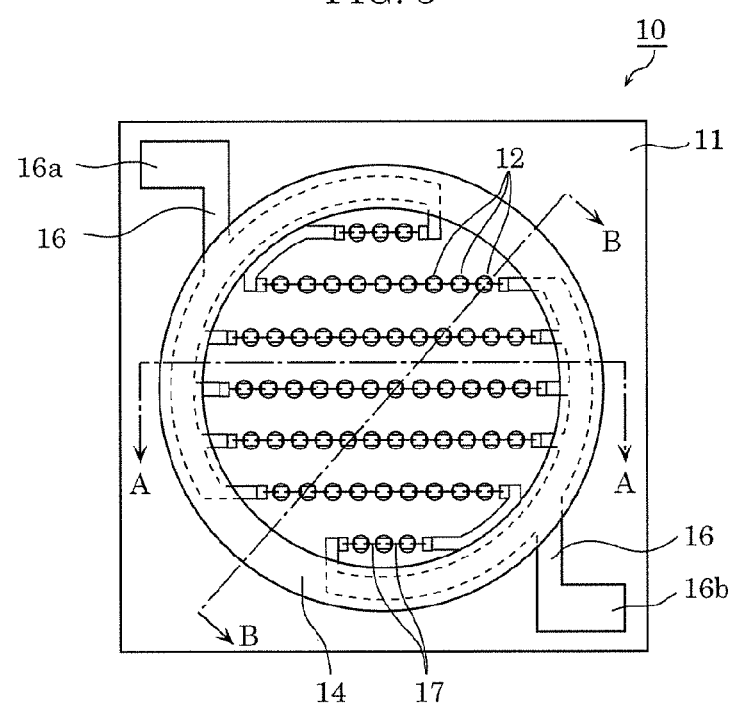
FIG. 3 is a plan view showing the internal structure of the light emitting apparatus according to Embodiment 1.
Figure 4:
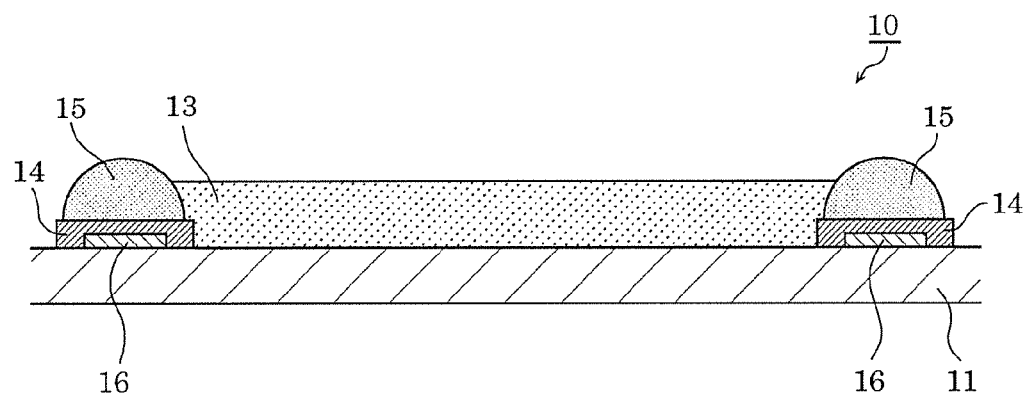
FIG. 4 is a cross-sectional view of the light emitting apparatus, taken along A-A in FIG. 2.
Figure 5:
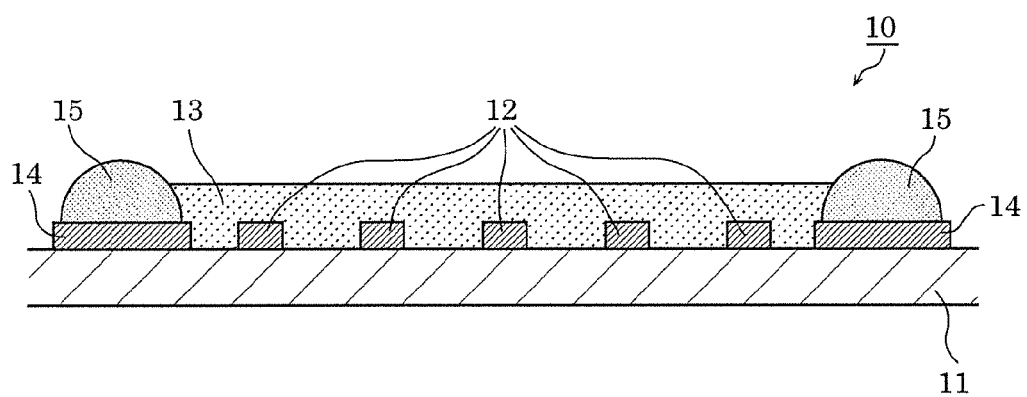
FIG. 5 is a cross-sectional view of the light emitting apparatus, taken along B-B in FIG. 2.

First, a configuration of a light emitting apparatus according to Embodiment 1 is described, with reference to the accompanying drawings. FIG. 1 is an external perspective view of the light emitting apparatus according to Embodiment 1. FIG. 2 is a plan view of the light emitting apparatus according to Embodiment 1. FIG. 3 is a plan view showing the internal structure of the light emitting apparatus according to Embodiment 1. FIG. 4 is a cross-sectional view of the light emitting apparatus, taken along A-A in FIG. 2. FIG. 5 is a cross-sectional view of the light emitting apparatus, taken along B-B in FIG. 2. It should be noted that FIG. 3 is a plan view of the light emitting apparatus from which sealing member 13 and dam material 15 in FIG. 2 are excluded, showing the internal structure, such as arrangement of LED chips 12 and an interconnection pattern.

As shown in FIGS. 1 through 5 light emitting apparatus 10 according to Embodiment 1 includes substrate 11, a plurality of LED chips 12, sealing member 13, buffer layer 14, and dam material 15.

Light emitting apparatus 10 is, what is known as, a COB (chip-on-board) LED module in which LED chips 12 are directly mounted on substrate 11.

Substrate 11 has an interconnect region in which line 16 is included. Line 16 (and electrodes 16a and 16b) is a metal line for supplying LED chips 12 with power. Substrate 11 is, for example, a metal base substrate or a ceramic substrate. Alternatively, substrate 11 may be a resin substrate based on a resin.

If substrate 11 is a ceramic substrate, the ceramic substrate is an alumina substrate comprising aluminum oxide (alumina), or an aluminum nitride substrate comprising aluminum nitride, or the like. If substrate 11 is a metal base substrate, the metal base substrate is an aluminum alloy substrate, an iron alloy substrate, a copper alloy substrate, or the like, which has an insulating film formed on its surface, for example. If substrate 11 is a resin substrate, the resin substrate is, for example, a glass-epoxy substrate comprising fiberglass and an epoxy resin.

For example, substrate 11 may be one that has high optical reflectance (e.g., optical reflectance of 90% or higher). Substrate 11 having high optical reflectance can reflect light emitted by LED chips 12 off the surface of substrate 11. As a result, the efficiency of light emitting apparatus 10 in extracting light is enhanced. Examples of such a substrate include a white ceramic substrate based on alumina.

Alternatively, substrate 11 may be a translucent substrate having high light-transmittance. Examples of such a substrate include a translucent ceramic substrate comprising polycrystalline alumina or aluminum nitride, a transparent glass substrate comprising glass, a quartz substrate comprising quartz, a sapphire substrate comprising sapphire, and a transparent resin substrate comprising a transparent resin material.

While substrate 11 is formed in a rectangular shape in Embodiment 1, it may be formed in any other shape, such as a circular shape.

LED chip 12 is by way of example of a light emitting element, and is a blue LED chip which emits blue light. LED chip 12 is, for example, a gallium-nitride-based LED chip comprising InGaN-based material, having a center wavelength (a peak wavelength of emission spectrum) of 430 nm or greater and 480 nm or less.

A plurality of lines of the light emitting elements, each element configured of LED chip 12, are disposed on substrate 11. As shown in FIG. 3, structurally, seven lines of light emitting elements are disposed on substrate 11 so as to conform to a circular shape.

Five lines of light emitting elements, each line including twelve LED chips 12 connected in series, are electrically disposed on substrate 11. The five lines of light emitting elements are connected in parallel, and emit light as power is supplied between electrode 16a and electrode 16b.

Moreover, although not shown in detail, Chip To Chip interconnection is established, mainly by bonding wires 17 between LED chips 12 which are connected in series (some of LED chips 12 are connected by line 16). Bonding wires 17, and line 16, and electrodes 16a and 16b described above, include metallic materials comprising, for example, gold (Au), silver (Ag), copper (Cu), or the like.

Sealing member 13 seals LED chips 12, bonding wires 17, and line 16. Sealing member 13, specifically, includes a translucent resin material comprising yellow phosphor particles as a wavelength conversion material. The translucent resin material is, for example, a silicone resin, but may be an epoxy resin or a urea resin, for example. Yellow phosphor particles are yttrium aluminum garnet (YAG)-based phosphor particles, for example.

According to this, a portion of blue light emitted by LED chips 12 is wavelength-converted into yellow light by the yellow phosphor particles included in sealing member 13. Then, a portion of blue light not absorbed by the yellow phosphor particles and the yellow light obtained by the wavelength-conversion by the yellow phosphor particles are diffused and mixed in sealing member 13. This allows sealing member 13 to emit white light. Sealing member 13 also serves to protect LED chips 12 and bonding wires 17 from refuse, moisture, external force, etc.

Buffer layer 14 is an underlying layer which is formed on substrate 11 to form dam material 15. In Embodiment 1, buffer layer 14 is a glass coated layer formed by coating substrate 11 with glass. In other words, buffer layer 14 comprises a glass material.

In Embodiment 1, buffer layer 14 is formed across an interconnect region and a region other than the interconnect region. Thus, substrate 11 has a portion (shown in FIG. 4) on which buffer layer 14 is formed over the interconnect region (line 16), and a portion (shown in FIG. 5) on which buffer layer 14 is directly formed.

Buffer layer 14 covers the substantially ring-shaped pattern of line 16 around the plurality of LED chips 12. In other words, buffer layer 14 is formed in a ring shape enclosing around the plurality of LED chips 12 when viewed from above. It should be noted that buffer layer 14 may be formed in a ring shape having a rectangular outline.

Buffer layer 14 has a thickness of about 5 μm to about 50 μm. It should be noted that the greater the thickness buffer layer 14 has, the less the amount of the material used to form dam material 15.

In Embodiment 1, the top surface of buffer layer 14 (the surface on which dam material 15 is formed) is a substantially flat surface. Buffer layer 14 is formed so as to have the top surface having a surface roughness higher than substrate 11. The surface roughness is determined by, for example, arithmetic mean values of respective parameters, such as arithmetic mean roughness (Ra), maximum height (Ry), ten-point mean roughness (Rz), mean spacing of profile irregularities (Sm), mean spacing of local peaks of the profile (S), and profile bearing length ratio (tp).

Buffer layer 14 is a feature component of light emitting apparatus 10. Advantageous effects obtained by light emitting apparatus 10 including buffer layer 14 are described below in detail.

Dam material 15 is for holding back sealing member 13 disposed on the top surface of buffer layer 14.

Dam material 15, for example, comprises a thermoset resin, a thermoplastic resin, or the like which has insulation properties. More specifically, dam material 15 comprises a silicone resin, a phenolic resin, an epoxy resin, a BT resin, PPA, or the like.

Desirably, dam material 15 has optical reflectivity to enhance the efficiency of light emitting apparatus 10 in extracting light. Thus, a white-colored resin (what is known as a white resin) is used as dam material 15 in Embodiment 1. It should be noted that, to enhance the optical reflectivity of dam material 15, dam material 15 may include particles of $TiO_2$, $Al_2O_3$, $ZrO_2$, MgO, etc.

In light emitting apparatus 10, dam material 15 is formed in a ring shape enclosing around the plurality of LED chips 12, when viewed from above. This achieves enhancement in efficiency of light emitting apparatus 10 in extracting light. It should be noted that dam material 15 may be formed in a ring shape having a rectangular outline, as with buffer layer 14.

[Method for Fabricating Light Emitting Apparatus]

Figure 6:
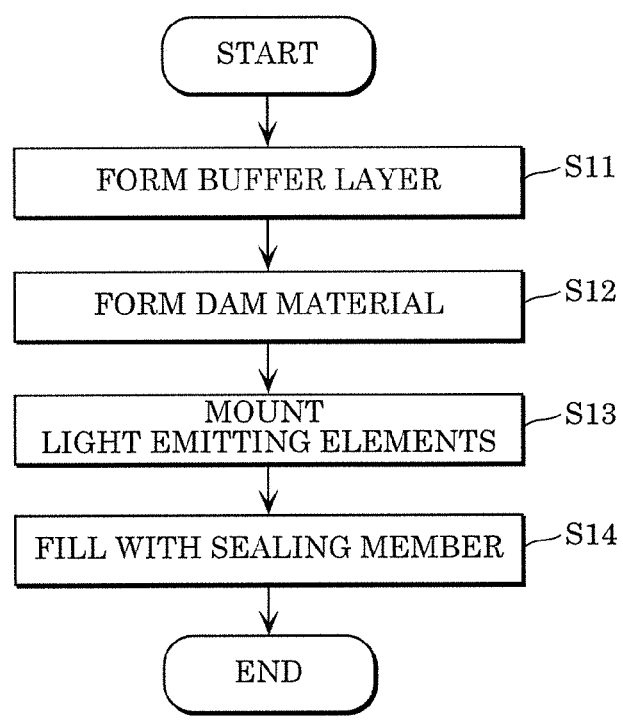
FIG. 6 is a flowchart illustrating a method for fabricating the light emitting apparatus according to Embodiment 1.
Figure 7:
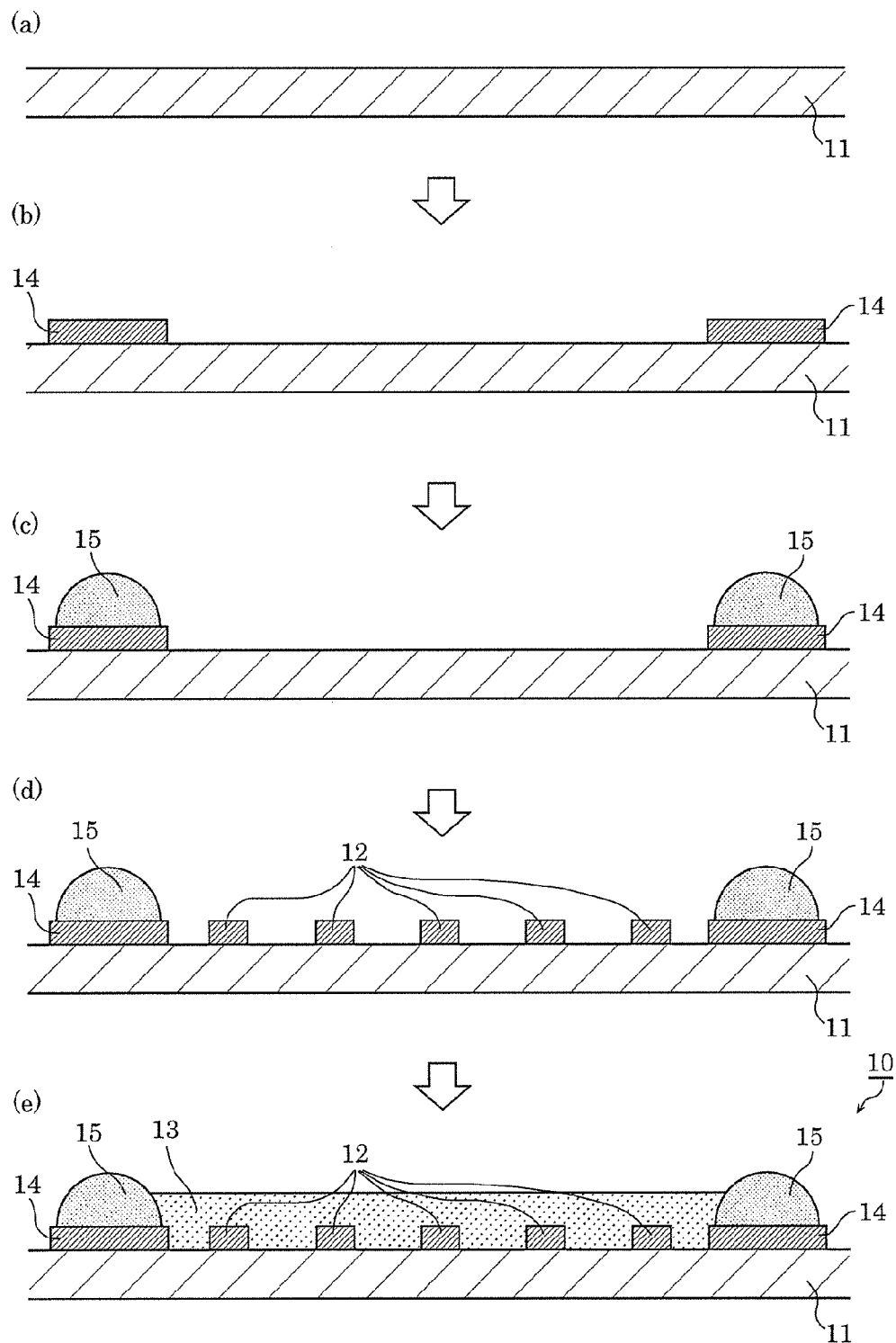
FIG. 7 shows cross-sectional views illustrating the method for fabricating the light emitting apparatus according to Embodiment 1.

Next, a method for fabricating light emitting apparatus 10 is to be described. FIG. 6 is a flowchart illustrating the method for fabricating light emitting apparatus 10. FIG. 7 shows cross-sectional views illustrating the method for fabricating light emitting apparatus 10. FIG. 7 shows sectional views of light emitting apparatus 10, taken along B-B in FIG. 2.

First, as illustrated in (a) and (b) of FIG. 7, buffer layer 14 is formed on substrate 11 (S11). Here, buffer layer 14 is formed, specifically, as follows.

First, powdered fritted glass (ground glass) is added a solvent and kneaded to prepare a paste for forming buffer layer 14.

Next, the paste for forming buffer layer 14 is printed in a predetermined shape onto a predetermined location on substrate 11. In Embodiment 1, the paste is printed in a ring shape enclosing around the plurality of LED chips 12. It should be noted that the paste for forming buffer layer 14 may be applied, rather than being printed.

Next, substrate 11 having the paste for forming buffer layer 14 printed thereon is fired. As substrate 11 is fired, the glass frit in the paste for forming buffer layer 14 is soften, forming a sintered glass film, as buffer layer 14, on substrate 11 and line 16.

After buffer layer 14 is formed, dam material 15 is formed on the top surface of buffer layer 14, as illustrated in (c) of FIG. 7 (S12). Dam material 15 is formed in a ring shape, as with buffer layer 14. Dam material 15 is formed, using a dispenser which discharges a white resin.

Next, as illustrated in (d) of FIG. 7, the plurality of LED chips 12 are mounted on substrate 11 (S13). LED chips 12 are die bonded using a die attach material or the like to mount them. At this time, the plurality of LED chips 12 are electrically connected with one another by bonding wires 17 and line 16.

Then, as illustrated in (e) of FIG. 7, the region enclosed around by dam material 15 is filled with (applied) sealing member 13 (S14). Specifically, the region enclosed around by dam material 15 is filled with the translucent resin material comprising yellow phosphor particles, and cured by being heated or exposed to light irradiation, for example.

[Effects]

In light emitting apparatus 10, buffer layer 14 is provided on which dam material 15 is provided.

In the case where buffer layer 14 is not included in light emitting apparatus 10, dam material 15 is formed across substrate 11 and line 16. In such a case, an interface is formed between dam material 15 and substrate 11 and between dam material 15 and line 16. In other words, two interfaces are formed, and thus dam material 15 is likely to cause interfacial peeling. It should be noted that shear test on dam material 15 of light emitting apparatus 10 not including buffer layer 14 shows that dam material 15 causes interfacial peeling, rather than cohesively failing.

In light emitting apparatus 10, in contrast, since dam material 15 is formed on the top surface of buffer layer 14, only one interface is formed. In other words, the adhesive strength of dam material 15 to buffer layer 14 can be increased higher than the adhesive strength of dam material 15 to substrate 11. In particular, increasing the surface roughness of the top surface of buffer layer 14 higher than the surface roughness of the top surface of substrate 11 further enhances the adhesive strength of dam material 15 to buffer layer 14. The adhesive strength (adhesion) is a parameter represented in N/m, and can be measured through stud-pull test, toppling test, scratch test, etc.

Additionally, as described above, buffer layer 14 is the glass coated layer, and thus the adhesive strength of buffer layer 14 to substrate 11 is high. As a result, buffer layer 14 is less likely to flake off from substrate 11 than dam material 15 directly formed on substrate 11.

In summary, in light emitting apparatus 10, the adhesive strength of buffer layer 14 to substrate 11 and the adhesive strength of dam material 15 to buffer layer 14 are higher than the adhesive strength of dam material 15 to substrate 11. This allows light emitting apparatus 10 to suppress flaking of dam material 15.

While in light emitting apparatus 10, buffer layer 14 is formed across the interconnect region and the region other than the interconnect region on substrate 11, it should be noted that buffer layer 14 may be formed on at least the interconnect region.

When dam material 15 is formed directly on the interconnect region, a sufficient adhesive strength of dam material 15 to the interconnect region is not obtained due to a small surface roughness of the interconnect material, which contributes to causing dam material 15 to be susceptible to flaking. For that reason, buffer layer 14 may be formed on at least the interconnect region. The adhesive strength of buffer layer 14 to the interconnect region and the adhesive strength of dam material 15 to buffer layer 14 are higher than the adhesion of dam material 15 to the interconnect region, which achieves suppressing flaking of dam material 15.

It should be noted that, when buffer layer 14 is formed across the interconnect region and the region other than the interconnect region as described above, adhesive strength of buffer layer 14 to the region other than the interconnect region is as high as such adhesive strength of buffer layer 14 to the interconnect region. In other words, the adhesive strength of buffer layer 14 to the region other than the interconnect region and the adhesive strength of dam material 15 to buffer layer 14 are higher than the adhesive strength of dam material 15 to the region other than the interconnect region.

[Variation]

If buffer layer 14 is a glass coated layer as with Embodiment 1, leakage light from buffer layer 14 due to the transparent nature of buffer layer 14 may be problematic.

Thus, buffer layer 14 may include a light reflecting member. The light reflecting member, specifically, comprises particles such as $TiO_2$, $Al_2O_3$, $ZrO_2$, and $MgO$, for example. The light reflecting member, however, may be any other member insofar as it has optical reflectivity.

The inclusion of the light reflecting member into buffer layer 14 as such achieves reduction of leakage light from buffer layer 14.

Embodiment 2

Figure 8:
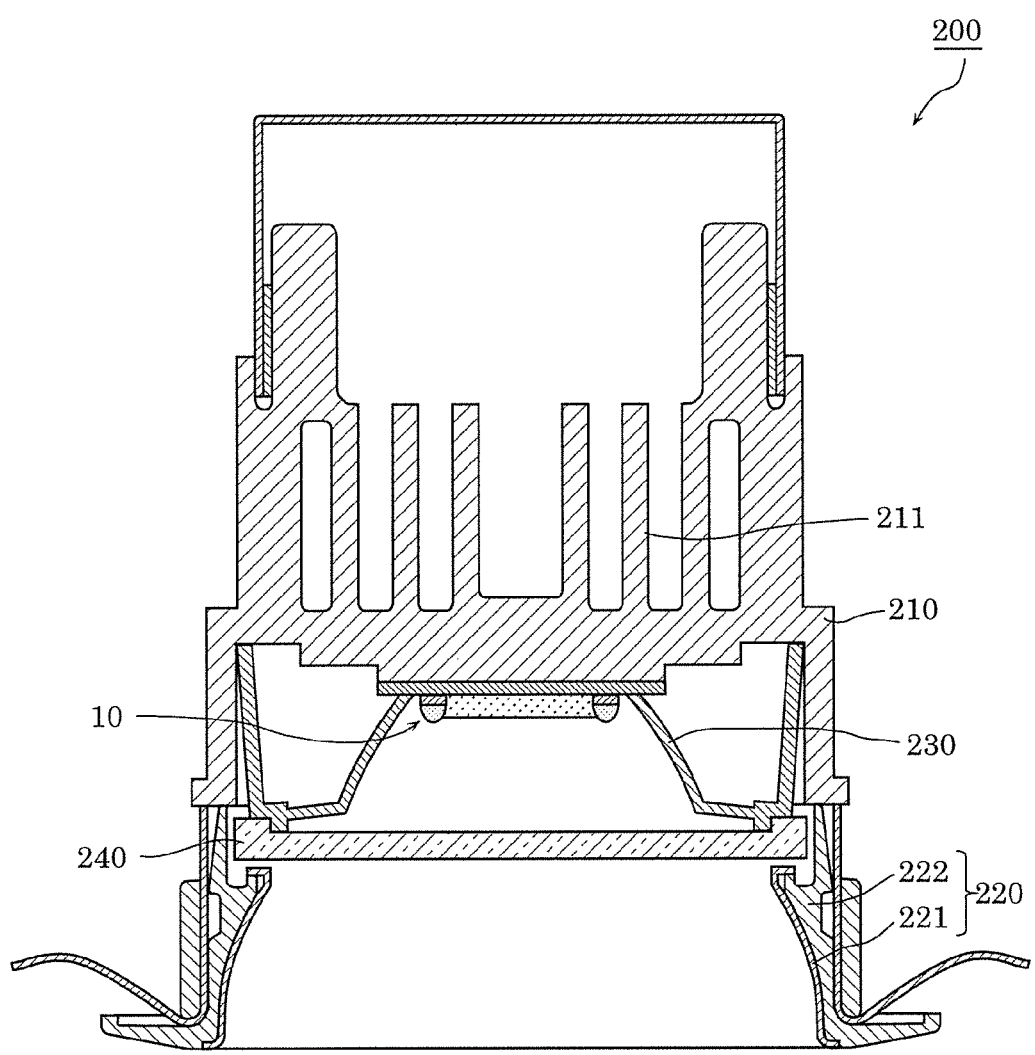
FIG. 8 is a sectional view of a lighting apparatus according to Embodiment 2.
Figure 9:
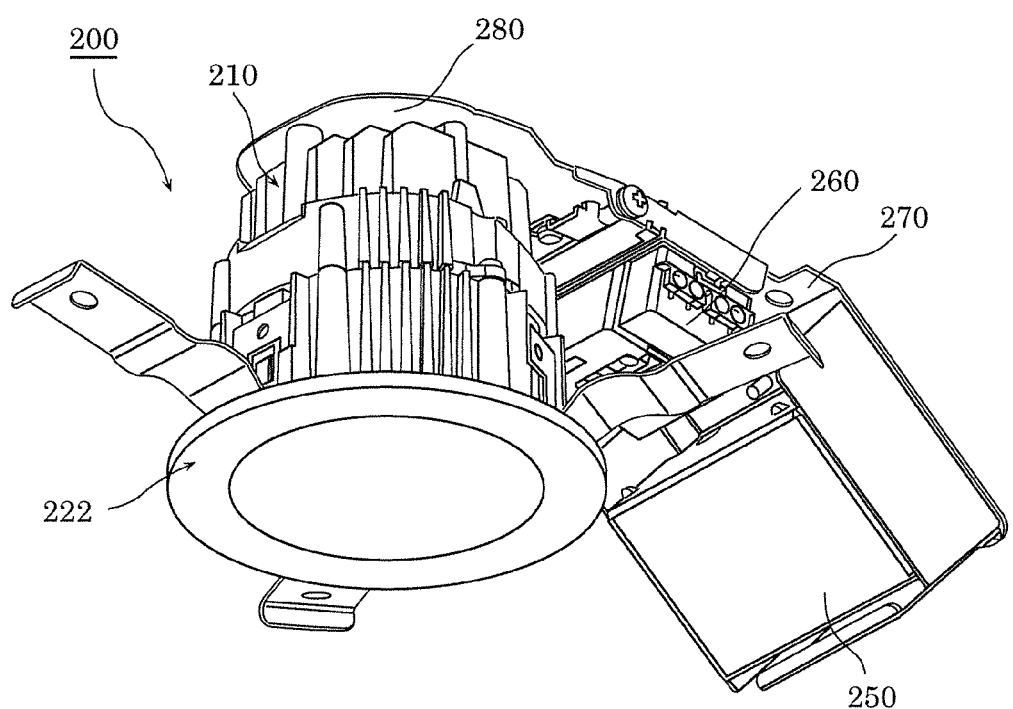
FIG. 9 is an external perspective view of the lighting apparatus and its peripheral components according to Embodiment 2.

Next, lighting apparatus 200 according to Embodiment 2 is to be described, with reference to FIGS. 8 and 9. FIG. 8 is a sectional view of lighting apparatus 200 according to Embodiment 2. FIG. 9 is an external perspective view of lighting apparatus 200 and its peripheral components according to Embodiment 2.

As shown in FIGS. 8 and 9, lighting apparatus 200 according to Embodiment 2 is, for example, a built-in lighting apparatus, such as a downlight, which is recessed into the ceiling in a house, for example, and emits light in a down direction (to a corridor, a wall, etc.).

Lighting apparatus 200 includes light emitting apparatus 10. Lighting apparatus 200 further includes a body having a substantially-closed-end cylindrical shape, configured of coupling base 210 and frame member 220 being coupled with each other, and reflector 230, and translucent panel 240 which are disposed on the body.

Base 210 is a mounting base on which light emitting apparatus 10 is mounted, serving also as a heat sink for dissipating heat generated by light emitting apparatus 10.

Base 210 is formed in a substantially cylindrical shape, using a metallic material. Base 210 is an aluminum die cast product in Embodiment 2.

On top of base 210 (a portion on the ceiling side), a plurality of heat dissipating fins 211 extending upward are disposed, being spaced at regular intervals along a direction. This can efficiently dissipate the heat generated by light emitting apparatus 10.

Frame member 220 includes cone 221 having a substantially-cylindrical shape and a reflective inner surface, and frame body 222 on which cone 221 is mounted. Cone 221 is molded using a metallic material. Cone 221 can be formed by drawing or press forming of aluminum alloy, for example. Frame body 222 is molded of a rigid resin material or a metallic material. Frame member 220 is fixed by frame body 222 mounted on base 210.

Reflector 230 is a ring-shaped (a funnel-shaped) reflective member having internal reflectivity. Reflector 230 can be formed using a metallic material, such as aluminum, for example. It should be noted that reflector 230 may also be formed of, rather than a metallic material, a rigid white resin material.

Translucent panel 240 is a translucent member having light diffusibility and light translucency. Translucent panel 240 is a flat plate disposed between reflector 230 and frame member 220, and mounted onto reflector 230. Translucent panel 240 can be formed in a disk shape, using a transparent resin material, such as acrylic or polycarbonate.

It should be noted that lighting apparatus 200 may not include translucent panel 240. Lighting apparatus 200 not including translucent panel 240 improves luminous flux of the light emitted from lighting apparatus 200.

Also as shown in FIG. 9, lighting apparatus 200 is connected with illumination apparatus 250 which supplies light emitting apparatus 10 with illumination power, and terminal block 260 which relays an alternating-current power from mains supply to illumination apparatus 250.

Illumination apparatus 250 and terminal block 260 are fixed to mounting plate 270 provided separately from the body. Mounting plate 270 is formed by bending a rectangular plate member comprising a metallic material. Illumination apparatus 250 is fixed onto the undersurface of one end portion of mounting plate 270, and terminal block 260 is fixed onto the undersurface of the other end portion. Mounting plate 270 is connected with top plate 280 fixed on top of base 210 of the body.

With the inclusion of light emitting apparatus 10 in lighting apparatus 200, flaking of dam material 15 is suppressed. In other words, lighting apparatus 200 can be said to be a highly reliable lighting apparatus.

While the downlight is illustrated as the lighting apparatus according to the present disclosure in Embodiment 2, the present disclosure may be implemented as any other lighting apparatus, such as a spot light.

Other Embodiments

While light emitting apparatus 10 and lighting apparatus 200 have been described above, the present invention is not limited to the exemplary embodiments described above.

While buffer layer 14 is a glass coated layer in the above exemplary embodiments, buffer layer 14 is not limited to such configuration. Buffer layer 14 may be of an inorganic compound other than glass or an organic compound, insofar as it achieves the configuration where the adhesive strength of buffer layer 14 to substrate 11 and the adhesive strength of dam material 15 to buffer layer 14 are higher than the adhesive strength of dam material 15 to substrate 11.

Moreover, while buffer layer 14 and dam material 15 are formed in ring shapes enclosing around LED chips 12 in the above exemplary embodiments, the shapes of buffer layer 14 and dam material 15, etc. are not particularly limited.

Moreover, in the above exemplary embodiments, light emitting apparatus 10 provides white light by a combination of LED chips 12 which emit blue light, and yellow phosphor particles. However, the configuration for providing white light is not limited thereto.

For example, LED chips 12 and the phosphor-containing resin containing red phosphor particles and green phosphor particles may be combined. Alternatively, ultraviolet LED chips which emit ultra violet light having shorter wavelengths than LED chips 12, and blue phosphor particles, green phosphor particles, and red phosphor particles, which respectively emit blue light, red light, and green light by being excited mainly by ultra violet light, may be combined.

Moreover, in the above exemplary embodiments, the Chip To Chip connection is established between LED chips 12 mounted on substrate 11 through bonding wires 17. LED chips 12, however, may be connected to line 16 (a metal film) on substrate 11 by bonding wires 17, and electrically connected to one another via line 16.

Moreover, in the above exemplary embodiments, LED chips 12 are illustrated as light emitting elements included in light emitting apparatus 10. However, the light emitting element may be a semiconductor light emitting element, such as a semiconductor laser, or any other type of solid state light-emitting device, such as an electro luminescence (EL) element, including, for example, an organic EL element and an inorganic EL element.

Moreover, light emitting apparatus 10 may include two or more types of light emitting elements having different emission colors. For example, in addition to LED chips 12, light emitting apparatus 10 may include LED chips which emit red light, for the purposes of enhancing color rendering.

In other instances, various modifications to the exemplary embodiments according to the present disclosure described above that may be conceived by those skilled in the art and embodiments implemented by any combination of the components and functions shown in the exemplary embodiments are also included within the scope of the present disclosure, without departing from the spirit of the present disclosure.

For example, the present disclosure may be implemented as a method for fabricating the lighting emitting apparatus, the method including the process of forming the buffer layer as described above.

While the foregoing has described what are considered to be the best mode and/or other examples, it is understood that various modifications may be made therein and that the subject matter disclosed herein may be implemented in various forms and examples, and that they may be applied in numerous applications, only some of which have been described herein. It is intended by the following claims to claim any and all modifications and variations that fall within the true scope of the present teachings.

What is claimed is:
1. A light emitting apparatus comprising:
a substrate on which a line is provided;
a light emitting element on the substrate;
a seal for sealing the light emitting element;
a glass layer provided directly on the substrate, the glass layer having a ring shape and covering at least a portion of the line; and a ring-shaped dam material on a top surface of the glass layer and laterally surrounding the seal, wherein the top surface of the glass layer has a surface roughness higher than a surface roughness of a surface of the substrate.

2. The light emitting apparatus according to claim 1, wherein the glass layer comprises an inorganic compound.

3. The light emitting apparatus according to claim 1, wherein an adhesive strength of the glass layer to an interconnect region of the substrate and the adhesive strength of the dam material to the glass layer are higher than an adhesive strength of the dam material to the interconnect region, when the dam material is directly formed on the interconnect region, the interconnect region being a region in which the line is provided.

4. The light emitting apparatus according to claim 3, wherein the glass layer is formed on the substrate, across the interconnect region and a region other than the interconnect region, and an adhesive strength of the glass layer to the region other than the interconnect region and the adhesive strength of the dam material to the glass layer are higher than an adhesive strength of the dam material to the region other than the interconnect region when the dam material is directly formed on the region other than the interconnect region.

5. The light emitting apparatus according to claim 1, wherein the glass layer and the dam material are formed in ring shapes enclosing around the light emitting element when viewed from above.

6. The light emitting apparatus according to claim 1 wherein the glass layer includes a light reflector.

7. A lighting apparatus comprising the light emitting apparatus according to claim 1; and an illumination source which supplies power to the light emitting apparatus.

8. The light emitting apparatus according to claim 1, wherein the surface of the substrate is a top surface of the substrate.

9. The light emitting apparatus according to claim 1, wherein the top surface of the glass layer is flat.

10. A light emitting apparatus comprising:

a substrate;

a light emitting element on the substrate;

a seal for sealing the light emitting element;

a glass layer provided directly on the substrate and having a ring shape; and a ring-shaped dam material on a top surface of the glass layer and laterally surrounding the seal, wherein the top surface of the glass layer has a surface roughness higher than a surface roughness of a surface of the substrate, increasing an adhesive strength of the dam material.

\* \* \* \* \*